United States Patent
Wakita (10) Patent No.: US 9,724,838 B2
(45) Date of Patent: Aug. 8, 2017

(54) CUTTING APPARATUS

(71) Applicant: DISCO CORPORATION, Tokyo (JP)

(72) Inventor: Nobuhiko Wakita, Tokyo (JP)

(73) Assignee: Disco Corporation, Tokyo (JP)

( * ) Notice: Subject to any disclaimer, the term of this patent is extended or adjusted under 35 U.S.C. 154(b) by 319 days.

(21) Appl. No.: 14/336,148

(22) Filed: Jul. 21, 2014

(65) Prior Publication Data

US 2015/0020670 A1 Jan. 22, 2015

(30) Foreign Application Priority Data

Jul. 22, 2013 (JP) ................. 2013-151913

(51) Int. Cl.
| | |
|---|---|
| *B26D 7/26* | (2006.01) |
| *B26D 7/22* | (2006.01) |
| *B28D 5/02* | (2006.01) |
| *H01L 21/304* | (2006.01) |
| *B27B 5/32* | (2006.01) |
| *B26D 1/14* | (2006.01) |

(Continued)

(52) U.S. Cl.
CPC ............. *B26D 7/2621* (2013.01); *B26D 7/22* (2013.01); *B27B 5/325* (2013.01); *B28D 5/022* (2013.01); *H01L 21/304* (2013.01); *B26D 1/14* (2013.01); *B26D 1/16* (2013.01); *B26D 5/00* (2013.01); *Y10T 83/85* (2015.04); *Y10T 83/9464* (2015.04)

(58) Field of Classification Search
CPC ........ B26D 7/2621; B26D 7/22; B28D 5/022; H01L 21/304
See application file for complete search history.

(56) References Cited

U.S. PATENT DOCUMENTS

| | | |
|---|---|---|
| 3,167,992 A | 2/1965 | Kury |
| 3,454,282 A | 7/1969 | Harrison |

(Continued)

FOREIGN PATENT DOCUMENTS

| | | | | |
|---|---|---|---|---|
| EP | 0 027 958 | 5/1981 | | |
| EP | 0027958 A1 | * 5/1981 | ............. | A61F 15/02 |

(Continued)

OTHER PUBLICATIONS

U.S. Appl. No. 14/333,170, filed Jul. 16, 2014.
U.S. Appl. No. 14/333,016, filed Jul. 16, 2014.

*Primary Examiner* — Joseph J Hail
*Assistant Examiner* — Joel Crandall
(74) *Attorney, Agent, or Firm* — Greer Burns & Crain Ltd.

(57) ABSTRACT

A cutting unit includes a spindle housing, a spindle, a mounter fixed to the front end portion of the spindle for supporting a cutting blade, and a fixing flange for fixing the cutting blade to the mounter. The mounter includes a boss portion for axially slidably supporting the fixing flange, the boss portion being fitted to an engaging hole formed in a central portion of the fixing flange, a flange portion projecting radially outward from the outer circumference of the boss portion, the flange portion having a supporting surface for supporting the cutting blade on the front side opposed to the fixing flange, and a cylindrical portion formed on the rear side of the flange portion. The flange portion has a suction hole opening. The cylindrical portion has a communication passage communicating with the suction hole. The communication passage is connected through a rotary joint to a suction unit.

2 Claims, 4 Drawing Sheets (51) Int. Cl.
*B26D 1/16* (2006.01)
*B26D 5/00* (2006.01)

(56) References Cited

U.S. PATENT DOCUMENTS

| | | | |
|---|---|---|---|
| 4,878,407 A | | 11/1989 | Harrison et al. |
| 5,104,370 A | | 4/1992 | Yerly et al. |
| 5,218,790 A | * | 6/1993 | Huang .................. B24B 55/102 451/359 |
| 6,030,326 A | * | 2/2000 | Azuma .................... B27B 5/30 483/30 |
| 6,148,526 A | | 11/2000 | Kirn et al. |
| 6,341,600 B1 | | 1/2002 | Wakita |
| 6,358,115 B1 | | 3/2002 | Koike et al. |
| 2006/0121840 A1 | | 6/2006 | Kim |

FOREIGN PATENT DOCUMENTS

| | | | |
|---|---|---|---|
| JP | 11-033907 | | 2/1999 |
| JP | 2007216377 A | * | 8/2007 |
| JP | 2009099940 A | * | 5/2009 |
| JP | 2009-119569 | | 6/2009 |
| JP | 2011031374 A | * | 2/2011 |
| JP | 2011-104726 | | 6/2011 |

\* cited by examiner

CUTTING APPARATUS

BACKGROUND OF THE INVENTION

1. Field of the Invention

The present invention relates to a cutting apparatus having a cutting blade for cutting a workpiece such as a semiconductor wafer.

2. Description of the Related Art

In a semiconductor device fabrication process, a plurality of crossing division lines called streets are formed on the front side of a substantially disk-shaped semiconductor wafer to thereby partition a plurality of regions where a plurality of devices such as ICs and LSIs are respectively formed. The semiconductor wafer thus having the plural devices is cut along the streets by using a cutting apparatus to thereby divide the regions where the devices are formed from each other, thereby obtaining the individual semiconductor devices as chips.

The cutting apparatus for cutting the semiconductor wafer as a workpiece along the streets includes workpiece holding means for holding the workpiece, cutting means having a rotatable cutting blade for cutting the workpiece held by the workpiece holding means, and feeding means for relatively moving the workpiece holding means and the cutting means in a feeding direction. The cutting means includes a spindle housing, a spindle rotatably supported to the spindle housing, a mounter fixed to the front end of the spindle, the mounter having a boss portion adapted to be inserted through a central opening of the cutting blade, and a fixing flange having an internal screw thread adapted to threadedly engage with an external screw thread formed on an end portion of the boss portion of the mounter. In mounting the cutting blade to the spindle, the boss portion of the mounter is first inserted through the central opening of the cutting blade, and the internal screw thread of the fixing flange is next threadedly engaged with the external screw thread of the boss portion of the mounter, thereby fixing the cutting blade between the mounter and the fixing flange (see Japanese Patent Laid-open No. Hei 11-33907, for example).

SUMMARY OF THE INVENTION

When the cutting blade is worn or chipped, it must be replaced with a new one and this replacement of the cutting blade with respect to the mounter is made relatively frequently. However, in the conventional cutting means mentioned above, it is necessary to perform an operation of tightening the fixing flange and an operation of loosening the fixing flange every time the cutting blade is replaced, causing a reduction in production efficiency.

Further, to prevent the fixing flange from loosening due to the rotation of the spindle in performing the cutting operation by the conventional cutting means, the spiral structure of the screw threads in the fixing flange and the mounter is reverse to the rotational direction of the spindle in general. Accordingly, a tightening force of the fixing flange is gradually increased with the progress of the cutting operation. As a result, in replacing the cutting blade, there is a case that the operation of loosening the fixing flange may be difficult to perform.

It is therefore an object of the present invention to provide a cutting apparatus which allows an operator to easily replace the cutting blade.

In accordance with an aspect of the present invention, there is provided a cutting apparatus including workpiece holding means for holding a workpiece, cutting means having a rotatable cutting blade for cutting the workpiece held by the workpiece holding means, and feeding means for relatively moving the workpiece holding means and the cutting means in a feeding direction. The cutting means includes a spindle housing, a spindle rotatably supported to the spindle housing, a mounter fixed to the front end portion of the spindle for supporting the cutting blade, and a fixing flange for fixing the cutting blade supported by the mounter to the mounter. The mounter includes a boss portion for axially slidably supporting the fixing flange, the boss portion being fitted to an engaging hole formed in a central portion of the fixing flange, a flange portion projecting radially outward from the outer circumference of the boss portion, the flange portion having a supporting surface for supporting the cutting blade on the front side opposed to the fixing flange, and a cylindrical portion formed on the rear side of the flange portion. The flange portion of the mounter is formed with a suction hole opening to the front side of the flange portion, the cylindrical portion of the mounter is formed with a communication passage communicating with the suction hole, and the communication passage is connected through a rotary joint to suction means. When the suction means is operated, a reduced pressure is applied through the rotary joint, the communication passage, and the suction hole to the space between the mounter and the fixing flange, so that the fixing flange is sucked toward the mounter to thereby fix the cutting blade between the mounter and the fixing flange.

Preferably, the cutting apparatus further includes a pressure sensor provided between the rotary joint and the suction means for detecting the reduced pressure, alarm means for generating an alarm in the case that the reduced pressure detected by the pressure sensor is higher than a predetermined value, and control means for outputting an alarm signal to the alarm means.

According to the present invention, when the suction means is operated, a reduced pressure is applied through the rotary joint, the communication passage, and the suction hole to the space between the mounter and the fixing flange, so that the fixing flange is sucked toward the mounter to thereby fix the cutting blade between the mounter and the fixing flange. Accordingly, in the case of replacing the cutting blade with a new one, it is only necessary for the operator to cancel the supply of the reduced pressure by the suction means and then engage and disengage the fixing flange with respect to the boss portion of the mounter. Accordingly, the operator can easily replace the cutting blade without the need for any special tool and skills. After replacing the cutting blade, the suction means is operated again to apply a reduced pressure through the rotary joint, the communication passage, and the suction hole to the space between the mounter and the fixing flange, thereby sucking the fixing flange toward the mounter. Accordingly, the new cutting blade can be fixed between the mounter and the fixing flange. Thus, the cutting blade can be efficiently replaced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
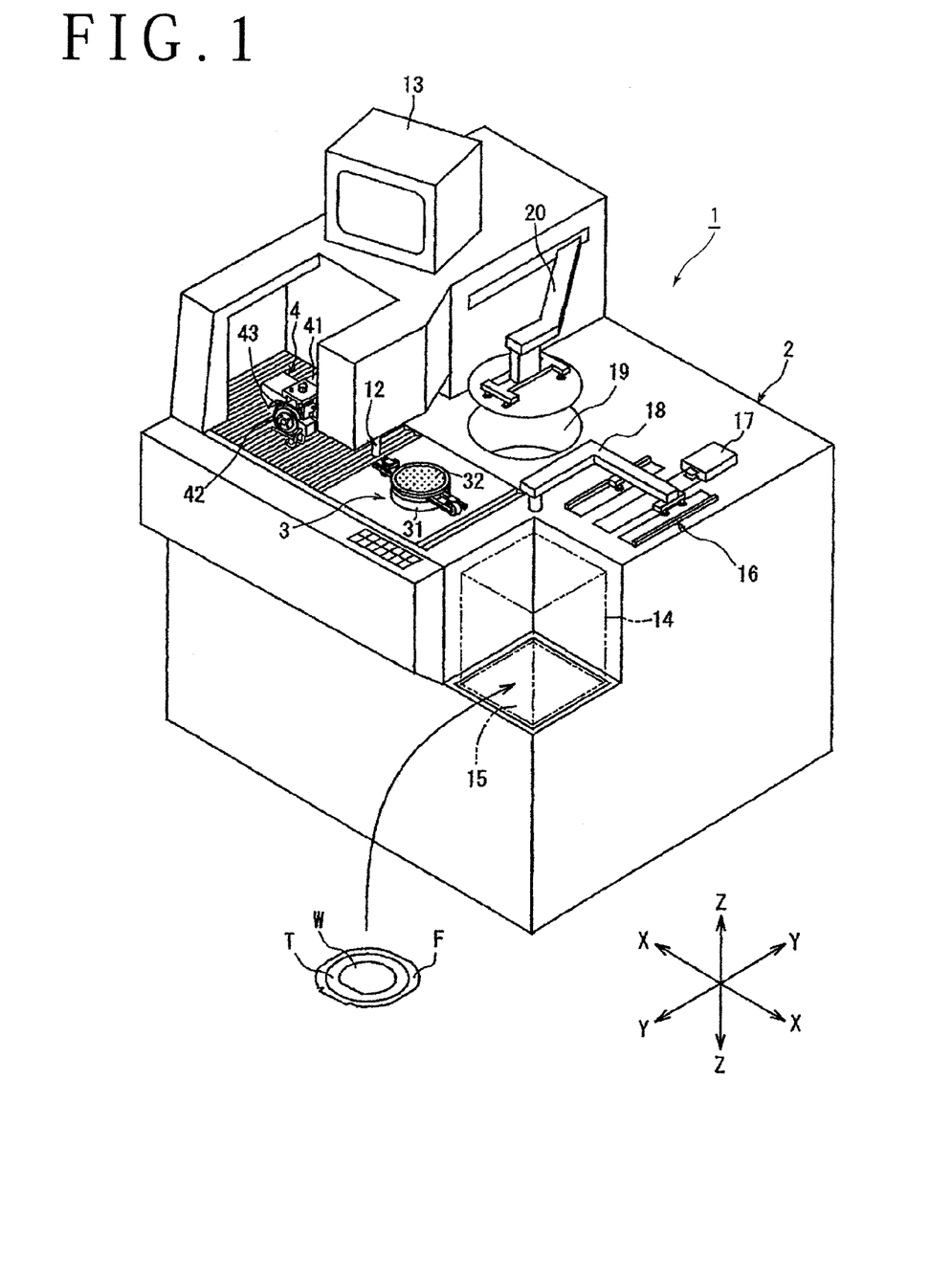
FIG. 1 is a perspective view of a cutting apparatus according to a preferred embodiment of the present invention.

A preferred embodiment of the cutting apparatus according to the present invention will now be described in detail with reference to the drawings. FIG. 1 is a perspective view of a cutting apparatus 1 according to this preferred embodiment. The cutting apparatus 1 includes a substantially box-like base housing 2. There is provided in the base housing 2 a chuck table 3 as workpiece holding means for holding a workpiece. The chuck table 3 is movable in the direction shown by an arrow X as a feeding direction. The chuck table 3 includes a vacuum chuck support 31 and a vacuum chuck 32 mounted on the vacuum chuck support 31. The vacuum chuck 32 has an upper surface as a holding surface for holding a disk-shaped semiconductor wafer as an example of the workpiece by operating suction means (not shown). Further, the chuck table 3 is rotatable by a rotating mechanism (not shown). The chuck table 3 is movable in the feeding direction shown by the arrow X by operating feeding means (not shown).

The cutting apparatus 1 includes a spindle unit 4 as cutting means. The spindle unit 4 includes a spindle housing 41 mounted on a moving base (not shown) and movable in the direction shown by an arrow Y as an indexing direction and in the direction shown by an arrow Z as a cutting direction. The spindle unit 4 further includes a spindle 42 rotatably supported to the spindle housing 41 and adapted to be rotationally driven by a rotational drive mechanism (not shown) and a cutting blade 43 detachably mounted on the spindle 42.

Figure 2:
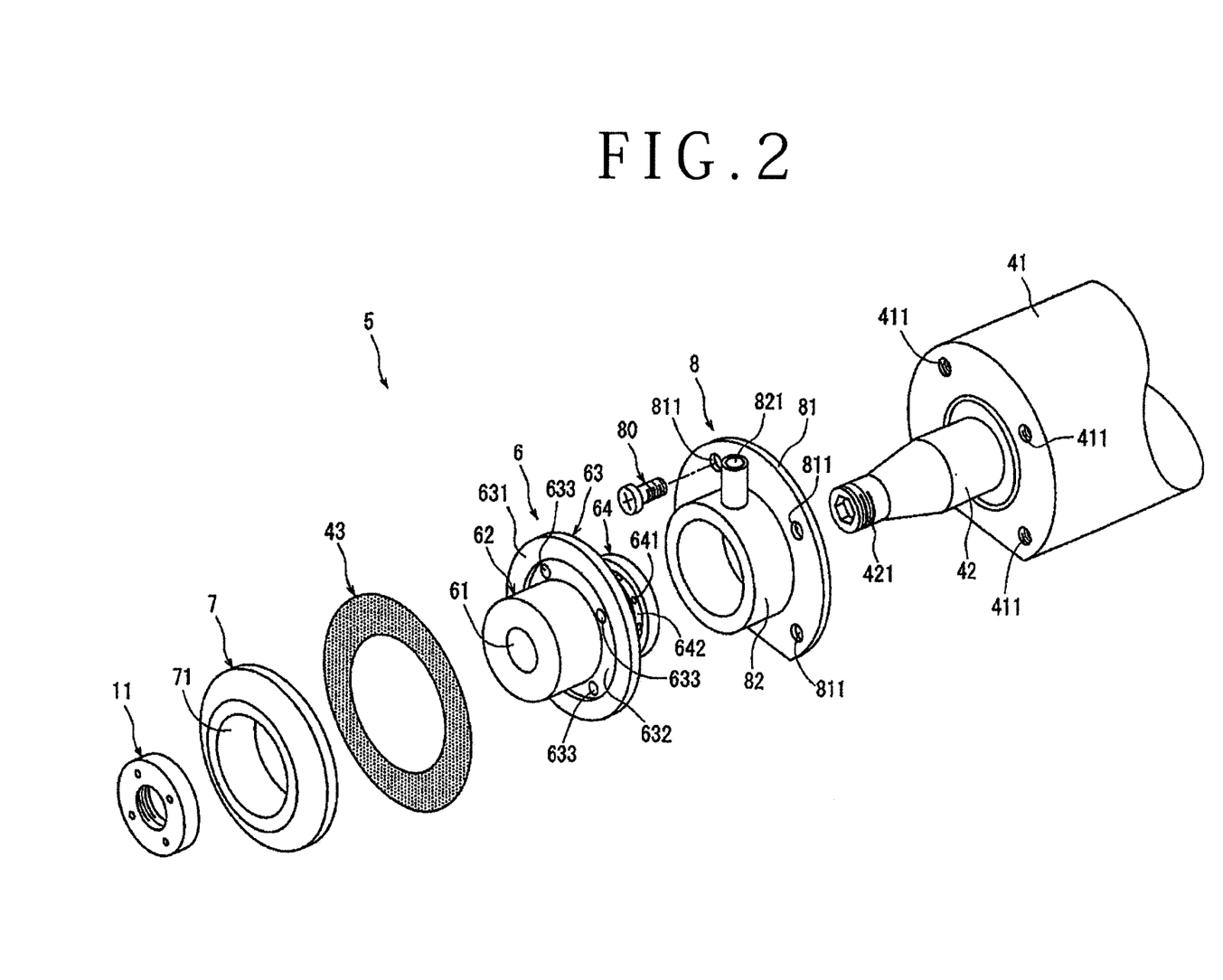
FIG. 2 is an exploded perspective view of a cutting blade mounting mechanism included in the cutting apparatus shown in FIG. 1.
Figure 3:
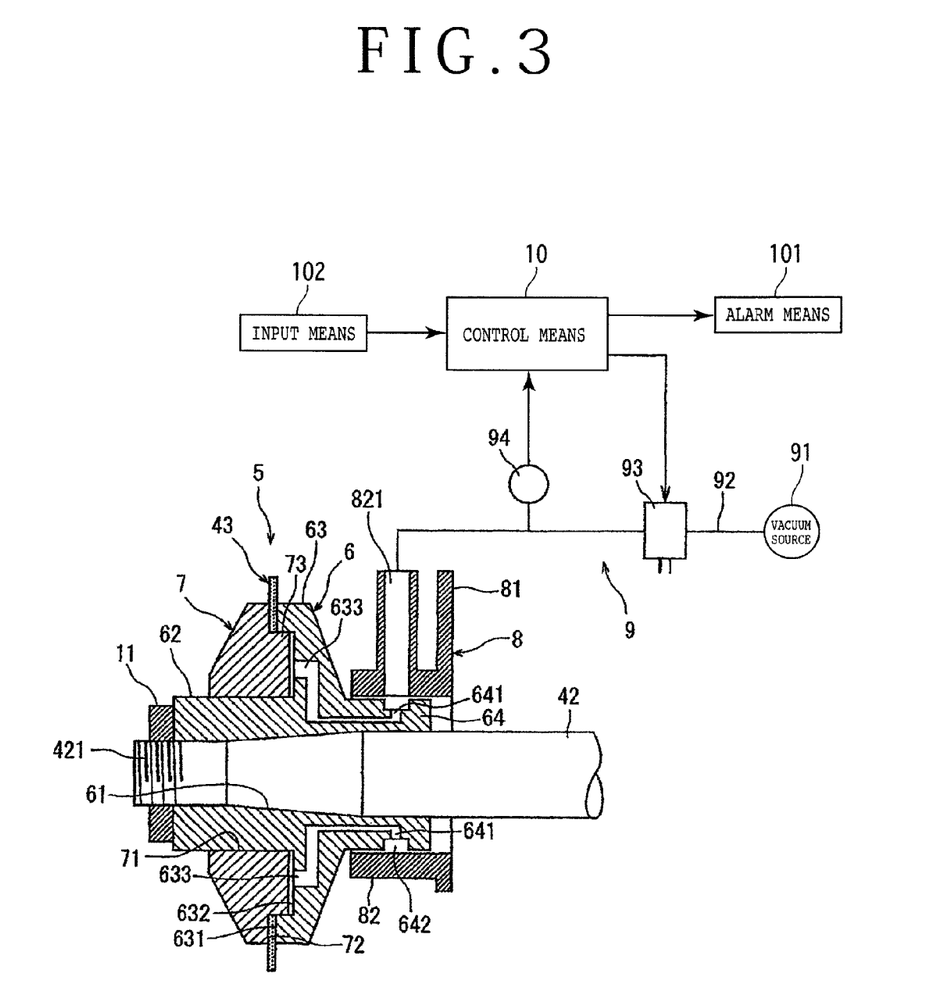
FIG. 3 is a sectional view of the cutting blade mounting mechanism shown in FIG. 2 in its assembled condition.

FIGS. 2 and 3 show a cutting blade mounting mechanism 5 for mounting the cutting blade 43 to the spindle 42. The cutting blade 43 in this preferred embodiment shown in FIGS. 2 and 3 is a so-called washer blade provided by only an annular cutting edge.

The cutting blade mounting mechanism 5 shown in FIGS. 2 and 3 includes a mounter 6 mounted on the front end portion (left end portion as viewed in FIG. 3) of the spindle 42 for supporting the cutting blade 43 and a fixing flange 7 for fixing the cutting blade 43 to the mounter 6 in cooperation therewith. The mounter 6 has a central engaging hole 61 adapted to engage the front end portion of the spindle 42. The engaging hole 61 has a tapering inner circumferential surface. The front end portion of the spindle 42 is also tapered so as to be fitted to the engaging hole 61 of the mounter 6. The mounter 6 includes a boss portion 62 for axially slidably supporting the fixing flange 7, a flange portion 63 projecting radially outward from the outer circumference of the boss portion 62, and a cylindrical portion 64 formed on the back side (right side as viewed in FIG. 3) of the flange portion 63. The front surface (left side surface as viewed in FIG. 3) of the flange portion 63 is formed as an annular supporting surface 631 for supporting the cutting blade 43. That is, the annular supporting surface 631 is formed along the outer circumference of the flange portion 63. Further, an annular engaging recess 632 is formed on the front surface of the flange portion 63 radially inside the annular supporting surface 631. The annular engaging recess 632 has an inner diameter substantially equal to the inner diameter of the cutting blade 43, i.e., the diameter of a central opening of the cutting blade 43. The flange portion 63 is formed with a plurality of suction holes 633 opening to the bottom surface of the annular engaging recess 632. The cylindrical portion 64 of the mounter 6 is formed with a plurality of communication passages 641 respectively communicating with the suction holes 633 of the flange portion 63. Further, an annular groove 642 is formed on the outer circumferential surface of the cylindrical portion 64, and the communication passages 641 open to the bottom of the annular groove 642.

The fixing flange 7 to be supported to the boss portion 62 of the mounter 6 has a central engaging hole 71 having an inner diameter substantially equal to the outer diameter of the boss portion 62. By fitting the engaging hole 71 of the fixing flange 7 to the boss portion 62 of the mounter 6, the fixing flange 7 is axially slidably supported to the boss portion 62. The back surface of the fixing flange 7 at its outer circumferential portion as opposed to the mounter 6 is formed as an annular supporting surface 72 facing the annular supporting surface 631 of the flange portion 63 of the mounter 6 with the cutting blade 43 interposed therebetween. The annular supporting surface 72 of the fixing flange 7 functions to support the cutting blade 43 in cooperation with the annular supporting surface 631 of the flange portion 63. Further, an annular engaging projection 73 is formed on the back surface of the fixing flange 7 radially inside the annular supporting surface 72. The annular engaging projection 73 has an outer diameter substantially equal to the inner diameter of the cutting blade 43. The engaging projection 73 of the fixing flange 7 is adapted to engage the engaging recess 632 of the flange portion 63 of the mounter 6.

The cylindrical portion 64 of the mounter 6 is rotatably fitted to a rotary joint 8, which is mounted on the front end of the spindle housing 41. The rotary joint 8 is composed of an annular mounting portion 81 adapted to be mounted on the front end of the spindle housing 41 and a cylindrical supporting portion 82 axially projecting from the annular mounting portion 81 so as to engage the cylindrical portion 64 of the mounter 6 so that the cylindrical portion 64 fixedly mounted on the spindle 42 is rotatable. As shown in FIG. 2, the annular mounting portion 81 of the rotary joint 8 is formed with a plurality of bolt insertion holes 811, and the front end surface of the spindle housing 41 is formed with a plurality of tapped holes 411 respectively corresponding to the plural bolt insertion holes 811 of the rotary joint 8. By inserting a plurality of tightening bolts 80 through the bolt insertion holes 811 of the rotary joint 8 and threadedly engaging the tightening bolts 80 with the tapped holes 411 of the spindle housing 41, the rotary joint 8 is mounted on the front end surface of the spindle housing 41. As shown in FIG. 3, the cylindrical supporting portion 82 of the rotary joint 8 is formed with a suction inlet 821 opening to the inner surface of the supporting portion 82. One end of the suction inlet 821 of the rotary joint 8 is in communication with the annular groove 642 of the cylindrical portion 64 of the mounter 6.

As shown in FIG. 3, the other end of the suction inlet 821 of the rotary joint 8 is in communication with suction means 9. The suction means 9 includes a vacuum source 91, a suction pipe 92 for connecting the vacuum source 91 and the suction inlet 821 of the rotary joint 8, and an electromagnetic three-way valve 93 provided in the suction pipe 92. The electromagnetic three-way valve 93 is adapted to select either a first operation mode where the communication between the vacuum source 91 and the rotary joint 8 is made or a second operation mode where the communication between the vacuum source 91 and the rotary joint 8 is interrupted to expose the suction inlet 821 of the rotary joint 8 to the atmosphere. There is provided a pressure sensor 94 for detecting the pressure in a portion of the suction pipe 92 between the electromagnetic three-way valve 93 and the suction inlet 821 of the rotary joint 8. The pressure sensor 94 is connected to control means 10 to transmit a pressure signal indicating the pressure detected by the pressure sensor 94. When the pressure detected by the pressure sensor 94 is higher than 0.02 MPa, for example, the control means 10 outputs an alarm signal to alarm means 101. Input means 102 is also connected to the control means 10 to allow an operator to input a cutting blade fixation signal, a cutting blade replacement signal, an operation start signal, etc. The control means 10 controls the electromagnetic three-way valve 93 according to the cutting blade fixation signal or the cutting blade replacement signal input from the input means 102.

The procedure of assembling the cutting blade mounting mechanism 5 will now be described with reference to FIGS. 2 and 3. First, the front end portion of the spindle 42 is inserted through the annular mounting portion 81 and the cylindrical supporting portion 82 of the rotary joint 8. Further, the plural tightening bolts 80 are inserted through the plural bolt insertion holes 811 of the annular mounting portion 81 of the rotary joint 8 and next threadedly engaged with the plural tapped holes 411 of the spindle housing 41. As a result, the rotary joint 8 is fixedly mounted on the front end surface of the spindle housing 41. Thereafter, the engaging hole 61 of the mounter 6 is fitted to the front end portion of the spindle 42, and the cylindrical portion 64 of the mounter 6 is rotatably engaged with the cylindrical supporting portion 82 of the rotary joint 8 as shown in FIG. 3. Thereafter, a tightening nut 11 is threadedly engaged with an external screw thread 421 formed on the outer circumference of the front end portion of the spindle 42. As a result, the mounter 6 is fixed to the front end portion of the spindle 42. Thereafter, the annular cutting blade 43 is fitted to the engaging projection 73 of the fixing flange 7, and the engaging hole 71 of the fixing flange 7 is fitted to the boss portion 62 of the mounter 6. Further, the engaging projection 73 of the fixing flange 7 is fitted to the engaging recess 632 of the mounter 6.

After fitting the cutting blade 43 to the engaging projection 73 of the fixing flange 7, next fitting the engaging hole 71 of the fixing flange 7 to the boss portion 62 of the mounter 6, and then fitting the engaging projection 73 of the fixing flange 7 to the engaging recess 632 of the mounter 6 as mentioned above, the cutting blade fixation signal is input from the input means 102 by the operator. As a result, the control means 10 operates the electromagnetic three-way valve 93 of the suction means 9 to select the first operation mode where the communication between the vacuum source 91 and the rotary joint 8 is made. Accordingly, the vacuum source 91 is brought into communication through the suction pipe 92, the suction inlet 821 of the supporting portion 82 of the rotary joint 8, the annular groove 642 and the communication passages 641 of the cylindrical portion 64 of the mounter 6, and the suction holes 633 of the flange portion 63 of the mounter 6 to the engaging recess 632 of the flange portion 63 of the mounter 6. Accordingly, a vacuum is applied to the engaging projection 73 of the fixing flange 7 fitted to the engaging recess 632 of the flange portion 63 of the mounter 6, so that the fixing flange 7 is sucked toward the flange portion 63 of the mounter 6. Accordingly, the cutting blade 43 is firmly fixed between the annular supporting surface 631 of the flange portion 63 of the mounter 6 and the annular supporting surface 72 of the fixing flange 7.

To maintain this fixed condition of the cutting blade 43 between the flange portion 63 of the mounter 6 and the fixing flange 7, the vacuum applied to the engaging projection 73 of the fixing flange 7 fitted in the engaging recess 632 of the flange portion 63 of the mounter 6 must be maintained at 0.02 MPa or less, for example. In this preferred embodiment, the pressure sensor 94 for detecting the pressure applied is provided in a portion of the suction pipe 92 between the electromagnetic three-way valve 93 of the suction means 9 and the suction inlet 821 of the rotary joint 8. Accordingly, the vacuum applied to the engaging projection 73 of the fixing flange 7 is detected by the pressure sensor 94, and a pressure signal indicating the vacuum detected by the pressure sensor 94 is transmitted to the control means 10. When the pressure detected by the pressure sensor 94 is higher than 0.02 MPa, for example, the control means 10 determines that it is difficult to maintain the fixed condition of the cutting blade 43 between the flange portion 63 of the mounter 6 and the fixing flange 7 and then outputs an alarm signal to the alarm means 101.

In the case that the cutting blade replacement signal is input from the input means 102 by the operator, so as to replace the cutting blade 43 with a new one, the control means 10 operates the electromagnetic three-way valve 93 of the suction means 9 to select the second operation mode where the suction inlet 821 of the rotary joint 8 is open to the atmosphere. As a result, the vacuum applied to the engaging projection 73 of the fixing flange 7 fitted to the engaging recess 632 of the flange portion 63 of the mounter 6 is relieved through the suction holes 633 of the flange portion 63 of the mounter 6, the communication passages 641 and the annular groove 642 of the cylindrical portion 64 of the mounter 6, the suction inlet 821 of the supporting portion 82 of the rotary joint 8, and the electromagnetic three-way valve 93 to the atmosphere. Accordingly, the fixing flange 7 can be easily removed from the boss portion 62 of the mounter 6, and the cutting blade 43 fitted to the engaging projection 73 of the fixing flange 7 can be easily removed. Thereafter, a new cutting blade 43 is fitted to the engaging projection 73 of the fixing flange 7, and the engaging hole 71 of the fixing flange 7 is fitted to the boss portion 62 of the mounter 6. Further, the engaging projection 73 of the fixing flange 7 is fitted to the engaging recess 632 of the mounter 6. Thereafter, the cutting blade fixation signal is input from the input means 102 by the operator, thereby firmly fixing the new cutting blade 43 between the annular supporting surface 631 of the flange portion 63 of the mounter 6 and the annular supporting surface 72 of the fixing flange 7 as mentioned above. In this manner, in the case of replacing the cutting blade 43 with a new one, it is only necessary for the operator to engage and disengage the fixing flange 7 with respect to the boss portion 62 of the mounter 6. Accordingly, the operator can easily replace the cutting blade 43 without the need for any special tool and skills.

Figure 4:
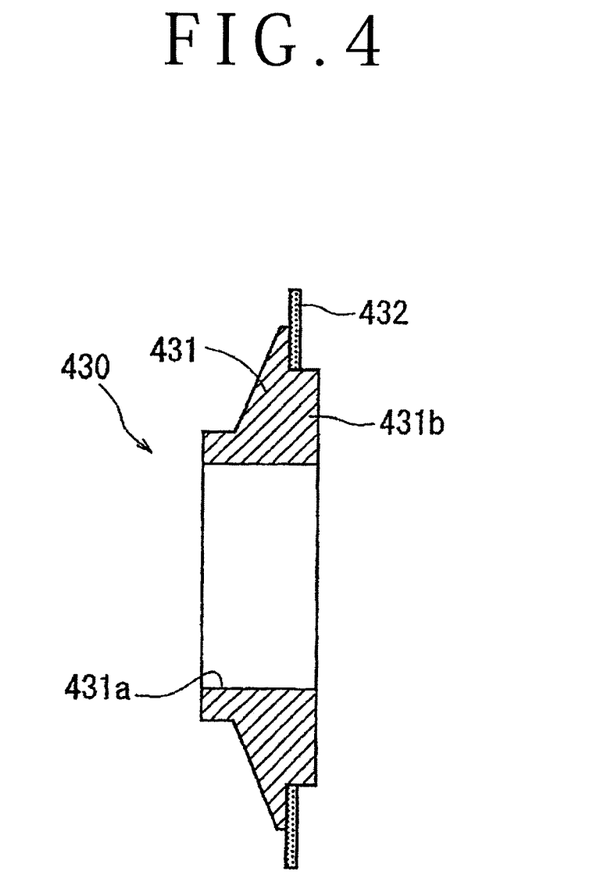
FIG. 4 is a sectional view of a hub blade as a modification of the cutting blade shown in FIGS. 2 and 3.

FIG. 4 shows a cutting blade 430 as a modification, where the cutting blade 430 is a so-called hub blade composed of a hub and an annular cutting edge provided on the outer circumferential portion of the hub. As shown in FIG. 4, the cutting blade 430 as a hub blade is composed of a disk-shaped hub 431 and an annular cutting edge 432 provided on one side surface of the hub 431 along the outer circumference thereof. The hub 431 is formed of aluminum, for example. The hub 431 has a central engaging hole 431a having an inner diameter substantially equal to the outer diameter of the boss portion 62 of the mounter 6. The hub 431 is formed with an engaging projection 431b equivalent to the engaging projection 73 of the fixing flange 7 shown in FIG. 3. The cutting edge 432 is formed by electroforming of diamond abrasive grains having a grain size of about 10 μm, for example. The disk-shaped hub 431 of the cutting blade 430 as a hub blade thus configured above has a function similar to that of the fixing flange 7 shown in FIG. 3. That is, by fitting the engaging hole 431a of the disk-shaped hub 431 to the boss portion 62 of the mounter 6 and fitting the engaging projection 431b of the hub 431 to the engaging recess 632 of the mounter 6, the hub 431 functions as similarly to the fixing flange 7.

Referring back to FIG. 1, the cutting apparatus 1 further includes an imaging mechanism 12 for imaging the front side of a workpiece held on the upper surface of the vacuum chuck 32 of the chuck table 3 to detect a subject area to be cut by the cutting blade 43 or check the condition of cut grooves. This imaging mechanism 12 is provided by optical means such as a microscope and a CCD camera. The cutting apparatus 1 further includes display means 13 for displaying an image obtained by the imaging mechanism 12.

The cutting apparatus 1 further includes a cassette 14 for storing a semiconductor wafer W as a workpiece. The semiconductor wafer W is stored in the cassette 14 in the condition where the wafer W is attached to a dicing tape T supported to an annular frame F. The annular frame F is formed of a metal material such as stainless steel. The cassette 14 is placed on a cassette table 15 vertically movable by elevating means (not shown).

The cutting apparatus 1 further includes temporary placing means 16 for temporarily placing the semiconductor wafer W taken out of the cassette 14, handling means 17 for handling the semiconductor wafer W to take it from the cassette 14 to the temporary placing means 16, and vice versa, first transfer means 18 for transferring the semiconductor wafer W from the temporary placing means 16 to the chuck table 3, cleaning means 19 for cleaning the semiconductor wafer W after cutting, and second transfer means 20 for transferring the semiconductor wafer W from the chuck table 3 to the cleaning means 19 after cutting.

The operation of the cutting apparatus 1 will now be described. When the operation start signal is input from the input means 102 by the operator in performing the cutting operation of the cutting apparatus 1, the control means 10 operates the electromagnetic three-way valve 93 of the suction means 9 to select the first operation mode where the communication between the vacuum source 91 and the rotary joint 8 is made. As a result, the vacuum source 91 is brought into communication through the suction pipe 92, the suction inlet 821 of the supporting portion 82 of the rotary joint 8, the annular groove 642 and the communication passages 641 of the cylindrical portion 64 of the mounter 6, and the suction holes 633 of the flange portion 63 of the mounter 6 to the engaging recess 632 of the flange portion 63 of the mounter 6. Accordingly, a vacuum is applied to the engaging projection 73 of the fixing flange 7 fitted to the engaging recess 632 of the flange portion 63 of the mounter 6, so that the fixing flange 7 is sucked toward the flange portion 63 of the mounter 6. As a result, the cutting blade 43 is firmly fixed between the annular supporting surface 631 of the flange portion 63 of the mounter 6 and the annular supporting surface 72 of the fixing flange 7. In the case of using the cutting blade 430 shown in FIG. 4 as a hub blade, the engaging projection 431b of the cutting blade 430 is sucked toward the flange portion 63 of the mounter 6 to thereby fix the cutting blade 430.

Thereafter, the cassette table 15 is vertically moved by the elevating means (not shown) to thereby vertically move the cassette 14 and set the semiconductor wafer W stored at a predetermined position in the cassette 14 to a given exit position (the semiconductor wafer W supported through the dicing tape T to the annular frame F will be hereinafter referred to simply as the semiconductor wafer W). Thereafter, the handling means 17 is operated to take the semiconductor wafer W set at the exit position from the cassette 14 to the temporary placing means 16. The semiconductor wafer W is next positioned by the temporary placing means 16. Thereafter, the first transfer means 18 is pivotally operated to transfer the semiconductor wafer W from the temporary placing means 16 to the chuck table 3 set at a standby position shown in FIG. 1. In this condition, the semiconductor wafer W is placed on the upper surface of the vacuum chuck 32 of the chuck table 3. Thereafter, the suction means (not shown) is operated to hold the semiconductor wafer W on the upper surface of the vacuum chuck 32 under suction. The chuck table 3 thus holding the semiconductor wafer W is next moved to a position directly below the imaging mechanism 12. When the chuck table 3 is positioned directly below the imaging mechanism 12, a plurality of division lines formed on the semiconductor wafer W are detected by the imaging mechanism 12, and the spindle unit 4 is moved in the Y direction as the indexing direction to thereby align the cutting blade 43 with a predetermined one of the division lines.

Thereafter, the cutting blade 43 is moved in the Z direction as the cutting direction by a predetermined amount and rotated in a predetermined direction. In this condition, the chuck table 3 holding the semiconductor wafer W is moved in the X direction as the feeding direction (the direction perpendicular to the axis of rotation of the cutting blade 43 in an X-Y plane) at a predetermined feed speed. As a result, the semiconductor wafer W held on the chuck table 3 is cut along the predetermined division line by the cutting blade 43 (cutting step). This cutting step is similarly performed along all of the division lines formed on the semiconductor wafer W to thereby divide the semiconductor wafer W into a plurality of individual semiconductor chips. The individual semiconductor chips thus divided from each other are kept attached to the dicing tape T to maintain the form of the semiconductor wafer W supported to the annular frame F. After finishing the cutting step along all of the division lines on the semiconductor wafer W as mentioned above, the chuck table 3 holding the semiconductor wafer W (the individual semiconductor chips supported through the dicing tape T to the annular frame F) is returned to the standby position shown in FIG. 1, and the operation of the suction means (not shown) is stopped to cancel the suction holding of the semiconductor wafer W on the chuck table 3. Thereafter, the semiconductor wafer W is transferred from the chuck table 3 to the cleaning means 19 by the second transfer means 20 and then cleaned by the cleaning means 19. Thereafter, the semiconductor wafer W is transferred from the cleaning means 19 to the temporary placing means 16 by the first transfer means 18. Thereafter, the semiconductor wafer W is returned from the temporary placing means 16 to the predetermined position in the cassette 14 by the handling means 17.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting apparatus comprising:
workpiece holding means for holding a workpiece;
cutting means having a rotatable cutting blade for cutting the workpiece held by the workpiece holding means; and
feeding means for relatively moving the workpiece holding means and the cutting means in a feeding direction;
the cutting means including a spindle housing, a spindle rotatably supported to the spindle housing, a mounter fixed to a front end portion of the spindle for supporting the cutting blade, and a fixing flange for fixing the cutting blade supported by the mounter to the mounter;
the mounter including a boss portion for axially slidably supporting the fixing flange, the boss portion being fitted to an engaging hole formed in a central portion of the fixing flange, a flange portion projecting radially outward from the outer circumference of the boss portion, the flange portion having a supporting surface for supporting the cutting blade on the front side opposed to the fixing flange, and a cylindrical portion formed on the rear side of the flange portion;
the flange portion of the mounter being formed with a suction hole opening to the front side of the flange portion, the cylindrical portion of the mounter being formed with a communication passage communicating with the suction hole, the communication passage being connected through a rotary joint to suction means;

wherein when the suction means is operated, a reduced pressure being applied through the rotary joint, the communication passage, and the suction hole to a space between the mounter and the fixing flange, so that the fixing flange is sucked toward the mounter to thereby fix the cutting blade between the mounter and the fixing flange.

2. The cutting apparatus according to claim 1, further comprising:
a pressure sensor provided between the rotary joint and the suction means for detecting the reduced pressure;
alarm means for generating an alarm in the case that the reduced pressure detected by the pressure sensor is higher than a predetermined value; and
control means for outputting an alarm signal to the alarm means.

* * * * *